(12) United States Patent
Groe et al.

(10) Patent No.: US 10,199,986 B2
(45) Date of Patent: Feb. 5, 2019

(54) CONTROLLED MUTING AND POWER RAMPING OF A VOLTAGE-CONTROLLED OSCILLATOR

(71) Applicant: OLYMPUS CORPORATION, Tokyo (JP)

(72) Inventors: John B. Groe, Poway, CA (US); Anton Karnitski, Minsk (BY); Kishore Rama Rao, San Diego, CA (US)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/739,675

(22) PCT Filed: Jun. 26, 2015

(86) PCT No.: PCT/US2015/038134
§ 371 (c)(1),
(2) Date: Dec. 22, 2017

(87) PCT Pub. No.: WO2016/209289
PCT Pub. Date: Dec. 29, 2016

(65) Prior Publication Data
US 2018/0198410 A1    Jul. 12, 2018

(51) Int. Cl.
*H03L 7/06* (2006.01)
*H03B 5/12* (2006.01)
*H03L 7/185* (2006.01)
*H03L 7/099* (2006.01)

(52) U.S. Cl.
CPC ......... *H03B 5/1215* (2013.01); *H03B 5/1234* (2013.01); *H03B 5/1253* (2013.01); *H03B 5/1278* (2013.01); *H03L 7/099* (2013.01); *H03L 7/185* (2013.01); *H03B 2200/004* (2013.01)

(58) Field of Classification Search
CPC ....... H01L 2924/00; H01L 2924/00014; H01L 2924/48227; H01L 2924/48091; H01L 2924/45099
See application file for complete search history.

(56) References Cited

U.S. PATENT DOCUMENTS

| 2005/0242898 | A1 | 11/2005 | Anand |
| 2009/0184776 | A1 | 7/2009 | Asakawa |
| 2009/0295491 | A1 | 12/2009 | Tsai |
| 2012/0169426 | A1 | 7/2012 | Chataigner |
| 2015/0180414 | A1* | 6/2015 | Lee .......................... H03B 7/06 327/157 |

OTHER PUBLICATIONS

ISR and Written Opinion for PCTUS2015038134 dated May 11, 2016.
Andrea Mazzandit et al., "Class C Harmonic CMOS VCOs, Wlht a General Result on Phase Noise", IEEE Journal of Solid-State Circuits, IEEE Service Center, Piscataway, NJ, USA, vol. 43, No. 12, Dec. 1, 2008 (Dec. 1, 2008), pp. 2716-2729.

* cited by examiner

*Primary Examiner* — Sibin Chen
(74) *Attorney, Agent, or Firm* — Sheppard Mullin Richter & Hampton LLP

(57) ABSTRACT

Systems and methods are provided in which a voltage-controlled oscillator for a radio transmitter includes a LC tank circuit, and a muting circuit. The LC tank circuit includes an inductive element and a capacitive element; wherein the inductive element of the LC tank circuit includes the antenna of the transmitter. The muting circuit can include a variable resistor connected in parallel with the LC tank circuit.

20 Claims, 13 Drawing Sheets

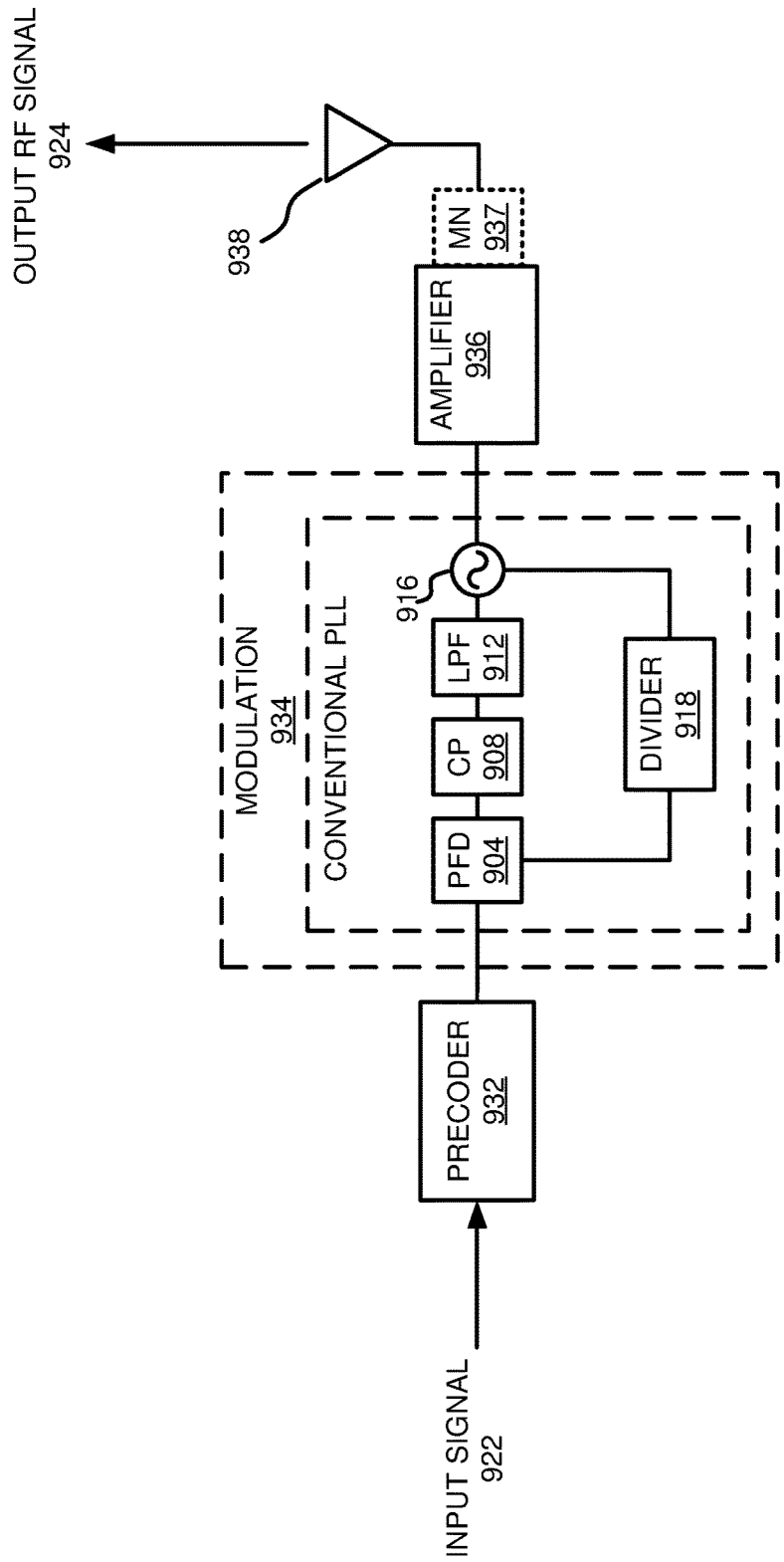
Fig. 9
Conventional

US 10,199,986 B2

CONTROLLED MUTING AND POWER RAMPING OF A VOLTAGE-CONTROLLED OSCILLATOR

CROSS-REFERENCE TO RELATED PATENT APPLICATIONS

This application is a U.S. national stage entry under 35 U.S.C. 371 of International Application No. PCT/US15/38134, which is incorporated herein by reference in its entirety.

TECHNICAL FIELD

The disclosed technology relates generally to communication systems, and more particularly, some embodiments relate to systems and methods for radio frequency transmitters with controlled muting and power ramping of a voltage-controlled oscillator.

DESCRIPTION OF THE RELATED ART

Wireless communication devices have become ubiquitous in today's society. Indeed, with the many continued advancements in communication technology, more and more devices are being introduced in both the consumer, commercial, and government sectors with advanced communications capabilities. Additionally, advances in processing power and low-power consumption technologies, as well as advances in data coding and modulation techniques have led to the proliferation of wired and wireless communications capabilities on a more widespread basis.

For example, communication networks are now commonplace in many home and office environments. Such networks allow various heretofore independent devices to share data and other information to enhance productivity or simply to improve their convenience to the user. Exemplary networks include the Bluetooth® communications network and various IEEE standards-based networks such as 802.11 and 802.16 communications networks, to name a few.

Additionally, tools, instrumentation, and other equipment used in a number of fields and industries have evolved to include wireless communication capabilities as part of their routine function. These communication capabilities can allow for information exchange including information such as, for example, command and control information to control the equipment; telemetry, data, or other information gathered by the equipment; status, reports, and other like "housekeeping" information; as well as other information that may be useful or necessary in the operation, use, deployment and maintenance of the equipment.

FIG. 1 is a simplified block diagram illustrating an example of a transmitter and a receiver that can be used with any of a number of wireless devices including equipment of the type mentioned above. Depending on the desired capabilities, these devices can include a transmitter, a receiver, or both (referred to as a transceiver). The transmitter conditions information 122 for transmission, and may include a precoder 132, a modulator 134, an amplifier 136, and an antenna 138. Those of ordinary skill in the art will understand that a wireless transmitter may include other functionality as well. Precoder 132 can be included to, for example, precode the data to optimize performance by taking into account channel parameters or characteristics.

Modulator 134 receives information to be transmitted and outputs a radio frequency (RF) modulated signal. Modulation is typically achieved by imposing the information signal 122 (whether or not precoded) onto a carrier signal at the desired carrier frequency. Modulation can be performed in the analog or digital domain depending on the information to be transmitted. Examples of fundamental digital modulation techniques include phase shift keying (PSK), frequency shift keying (FSK), quadrature amplitude modulation (QAM), and variations of the foregoing, although other digital modulation techniques are known and can be used.

Following modulation at modulator 134, conventional transmitters use an amplifier 136 to amplify the signal and couple the modulated signal to the antenna 138 for transmission. An amplifier 136 advantageously allows the transmitter to accommodate a wide range of output power levels at antenna 138. Antenna 138 radiates the modulated signal as an electromagnetic wave across the communication channel 124 (e.g., the air). Likewise, an antenna 148 is also included at the receiver. On the receive side, antenna 148 is used to capture the electromagnetic signal radiated across the communication channel. In embodiments using a transceiver, the transmit and receive operations of the transceiver can use the same or separate antennas.

As noted above, modulator 134 and demodulator 144 can be chosen to implement any of a number of desired modulation techniques, one of which is PSK modulation. PSK modulation is a digital modulation technique that uses changes in phase of the carrier signal to represent the information to be transmitted. PSK modulation uses a finite number of phases to represent bits or symbols in the information data. Accordingly, the incoming information stream 122 is typically mapped to a particular phase. At the receiver, the demodulator determines the phase of the receive signal and maps it back to the symbol it represents. In this manner, the original information 122 can be recovered. PSK modulation can be implemented using two or more phases (e.g. QPSK).

PSK Modulation can be accomplished a number of different ways. One way to generate PSK modulation at the RF carrier frequency is through the use of a phase-locked loop. The phase-locked loop uses feedback to drive its output phase to track its input phase. It follows then that setting the input phase to the phase-locked loop imposes the PSK modulation unto the RF carrier.

FIG. 2 is a block diagram illustrating a typical Phase-Locked Loop (PLL) architecture. The phase-locked loop 200 commonly includes a phase/frequency detector (PFD) 204, charge pump (CP) 208, low-pass filter (LPF) 212, voltage-controlled oscillator (VCO) 216, and a divider 218.

In operation, phase/frequency detector 204 is connected to compare an input signal 202 (also referred to herein as the "reference signal"), and the divided voltage-controlled oscillator output signal from divider 218. The phase/frequency detector 204 compares the phase and/or frequency of the input signal 202 with the phase and/or frequency of the divided voltage-controlled oscillator 216 signal and generates difference signal that is proportional to the phase and/or frequency difference between the input signal 202 and the divided voltage-controlled oscillator 216 signal. The phase/frequency detector 204 produces an UP signal when the phase of the reference signal 202 leads the phase of the divided output signal from the voltage-controlled oscillator 216, and a DOWN signal when the phase of the reference signal 202 lags the phase of the divided output signal from the voltage-controlled oscillator 216.

The charge pump 208 is configured to receive the output signal from the phase/frequency detector 204 and converts the output signals of the phase/frequency detector 204 into a corresponding charge pump 208 output current. The charge pump 208 produces a charge pump current proportional to the phase/frequency detector 204 output signal. The output current generated by charge pump 208 is provided to the low-pass filter 212, which filters out unwanted noise and generates a voltage that is used to tune the frequency of the voltage-controlled oscillator 216.

In operation, the low-pass filter 212 filters unwanted noise it receives from the charge pump 208, and outputs a voltage signal that is used to tune the voltage-controlled oscillator 216. An ideal low-pass filter 212 outputs a constant voltage as long as no additional charge current is applied by the charge pump 208 (i.e. the low-pass filter 212 voltage will be constant when the applied charge pump 208 current is zero). In practice, the low-pass filter 212 limits how quickly the voltage that is used to tune the voltage-controlled oscillator 216 can change. This is primarily due to the stability of the feedback loop around the phase-locked loop 200. As a result, the low-pass filter 212 limits the bandwidth of the input reference signal that can be tracked by the phase-locked loop 200 and thereby limits the bandwidth of a PSK-modulated signal produced by the voltage-controlled oscillator 216.

Conventional solutions have also used offset phase-locked loops. The offset phase-locked loop commonly includes a phase/frequency detector, a charge pump, a first low-pass filter, a voltage-controlled oscillator, and a feedback path that includes a downconverting mixer. The offset PLL converts the signal to be transmitted to a radio frequency (RF) signal directly and can be implemented to avoid using a conventional upconversion mixer.

FIG. 3 is a block diagram illustrating a typical voltage-controlled oscillator 366. Voltage-controlled oscillators are typically configured with resonator circuitry commonly referred to as an LC tank 354. The transistors 351, 352, 361, 362 add energy to the tank to replenish losses due to nonideal and unwanted parasitic elements. LC tank 354 is an electric circuit having an inductor 356 and a capacitor, usually a variable capacitor 358, connected either in series or in parallel. The LC tank 354 operates as the resonator unit of the VCO 366, generating a signal at the frequency dictated by the voltage provided across the variable capacitor 358. The frequency generated is related to the capacitance of the variable capacitor 358 in the LC tank 354. Traditionally, variable capacitor 358 is often realized by a varactor diode, which may be implemented as a p-n junction in reverse bias. It is well known that any reverse-biased semiconductor diode displays a measure of voltage-dependent capacitance that can be changed by varying the input voltage (i.e. the control voltage) applied to the diode. Accordingly, changes in the input voltage can be used to change the capacitance of the LC tank 354, which changes the frequency at which the LC tank 354 resonates.

In the example illustrated in FIG. 2, the output signal from the voltage-controlled oscillator 216 is coupled back through the phase-locked loop feedback loop. As shown in FIG. 2, phase-locked loops commonly include a frequency divider 218 between the voltage-controlled oscillator 216 and the feedback input to the phase/frequency detector 204.

A primary purpose of the conventional phase-locked loop is to correct for the noise generated by any one or more elements in the transmitter (e.g. the voltage-controlled oscillator 216, phase/frequency detector 204, charge pump 208, and/or low-pass filter 212). Ultimately, the difference between the signal generated by the voltage-controlled oscillator 216 and the input signal is quantified, measured and adjusted using information returned via the feedback loop. That is, phase-locked loop 200 receives feedback reflecting any non-ideal behavior of its components (i.e. in the form of a detected phase offset), and uses this feedback to self-correct. However, some noise can still remain in the system. Noise from any one or a combination of these elements in the phase-locked loop system will cause the phase of the reference signal and the phase of the VCO signal to move apart (i.e. phase drift) even if the phases of the two signals are initially aligned. This difference increases as the phase/frequency offset between the reference signal and the VCO output signal increases due to the limited bandwidth of the low-pass filter 212. Phase drift and phase noise can cause problems such as, for example, increased bit errors, reduced phase tracking accuracy, and higher manufacturing/operating costs.

As noted above, the information signal is modulated onto the RF signal (i.e., the carrier) generated by the VCO. Conventional transmitters commonly provide the VCO output signal to an amplifier for transmission via an antenna. To optimize efficiency of the transmitter, the impedance of the output signal from the amplifier should conjugately match the impedance at the input to the antenna. A closer match results in a greater power transfer efficiency between the amplifier and the antenna, but this theoretically peaks at 25%. Impedance mismatches, on the other hand, result in part of the signal being reflected from the load (antenna) back toward the source (amplifier). This results in power loss and transmission errors.

Accordingly, the antenna is typically coupled to the amplifier using a matching network. The matching network matches the impedance of the transmitter with the impedance of the load (e.g., the antenna the matching network). Matching networks are important to improve power transfer and minimize the standing wave ratio (SWR) along the transmission line to the antenna. In some systems, impedance matching is used to minimize reflections by making the load impedance match the source impedance. If these elements are purely resistive, then matching to minimize reflections is generally sufficient to optimize power transfer. However, where reactive components are involved, complex conjugate matching may be used. Complex conjugate matching attempts to achieve a situation in which the load impedance matches the complex conjugate of the source impedance:

$$Z_{load} = Z^*_{source}$$

Using an amplifier to drive the antenna as described above allows the transmitter to accommodate a wide range of output power levels. Unfortunately, although matching networks improve the impedance mismatch, peak power transfer is still limited.

The bandwidth of the matching network depends on several factors. The quality factor or Q of a simple matching network is given by $$Q = \sqrt{\frac{R_{max}}{R_{min}}}$$

where $R_{max}$ and $R_{min}$ are the maximum and minimum resistances for the amplifier output and the antenna. High Q values map to narrow bandwidth networks. Moreover, high Q matching networks show greater sensitivity to changes in the antenna impedance. These changes lead to even less radiated RF power. In practice, it is possible to lower the Q factor by adding more stages to the matching network, but this adds complexity. Most practical matching networks have a Q of ten or less.

The offset PLL tracks the phase of the reference signal and impresses it upon the VCO output. It uses feedback to drive any phase error seen at the phase/frequency detector towards zero. The bandwidth of the PLL feedback loop is limited by stability issues to typically 1 MHz or less. This bandwidth in turn sets the bandwidth of the modulation supported by the offset PLL.

It is difficult to design a PLL suitable for wideband modulation that is also stable. In general, the phase/frequency detector of the PLL should sample the phase error at a rate at least ten times higher than the loop bandwidth. This therefore drives the frequency of the reference signal higher. In addition, typical component variations shift the bandwidth ±50% or more. The large swing in the PLL response generates distortion (when the loop bandwidth is lower) and degrades stability (when the loop bandwidth is higher).

In addition to mismatch, conventional RF transmission systems may suffer from spectral splatter. Spectral splatter refers to spurious emissions caused by nonlinear behavior. These may be exacerbated when the transmitted signal power is abruptly changed or switched on/off. A PLL operates in one of two modes: acquisition or tracking. The acquisition process initiates any time the PLL changes state; it slews the VCO output frequency and phase to align with the reference input signal. In half-duplex communication systems, where the system alternates between transmit and receive modes, a PLL reinitiates acquisition mode each time the transmitter is activated. Turning on the PLL and in particularly, the VCO, typically results in spectral splatter.

Moreover, the acquisition process drives the VCO output through a range of frequencies to ultimately reduce the phase error seen at the PFD. This results in more spectral splatter. Also, it is common for the PLL to require calibration to meet certain accuracy requirements. The calibration process invariably disturbs the PLL and re-triggers the phase acquisition process. Such spurious emissions fall outside the intended frequency band. Spectral splatter can also lead to emissions that violate government regulations.

BRIEF SUMMARY OF EMBODIMENTS

According to various embodiments of the disclosed technology solutions are presented to provide a continuously and automatically tuned radio frequency transmitter, without the need for additional matching circuitry commonly found in traditional transmitter architectures having an amplifier output. In such embodiments, the technology may be directed toward solutions to provide for a reduction in signal power losses common in traditional transmission systems.

In some embodiments, systems and methods are provided in which a voltage-controlled oscillator for a radio transmitter includes a LC tank circuit, and a muting circuit. The LC tank circuit includes an inductive element and a capacitive element; wherein the inductive element of the LC tank circuit may include the antenna of the transmitter. The muting circuit can include a variable resistor connected in parallel with the LC tank circuit. In other embodiments, a voltage-controlled oscillator for a radio transmitter may include a LC tank circuit, and a means for controlling the output of the voltage-controlled oscillator.

In further embodiments a radio frequency transmitter can include: an antenna; and an offset phase-locked loop coupled to the antenna and having an input configured to receive an information signal. The phase-locked loop may further include a phase detection circuit including a first input configured to receive the information signal and a second input configured to receive a feedback signal; a charge pump including an input coupled to the phase detection circuit and an output; a filter including an input coupled to the output of the charge pump; a voltage-controlled oscillator coupled to the charge pump, the voltage-controlled oscillator comprising a LC tank circuit, and a muting circuit; and a feedback path, the feedback path comprising a downconverter and a filter, the downconverter including an input coupled to the voltage-controlled oscillator, and the filter including an input coupled to the downconverter and an output coupled to the second input of the phase detection circuit.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology, as well as drawings illustrating pertinent related art. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 9 is a diagram illustrating a conventional transmitter.

Figure 1:
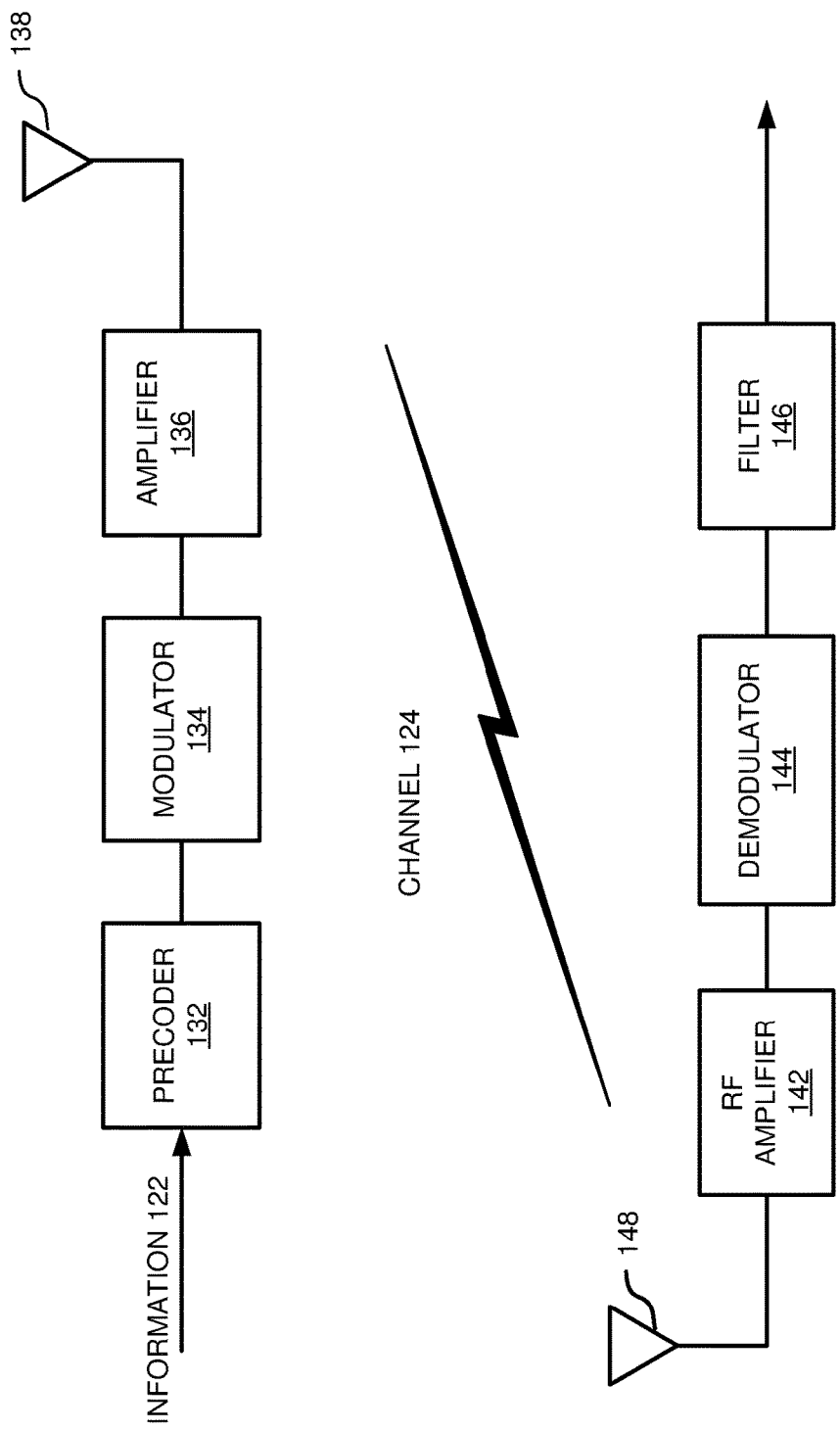
FIG. 1 is a simplified block diagram illustrating an example of a transmitter and a receiver that can be used with wireless devices.
Figure 2:
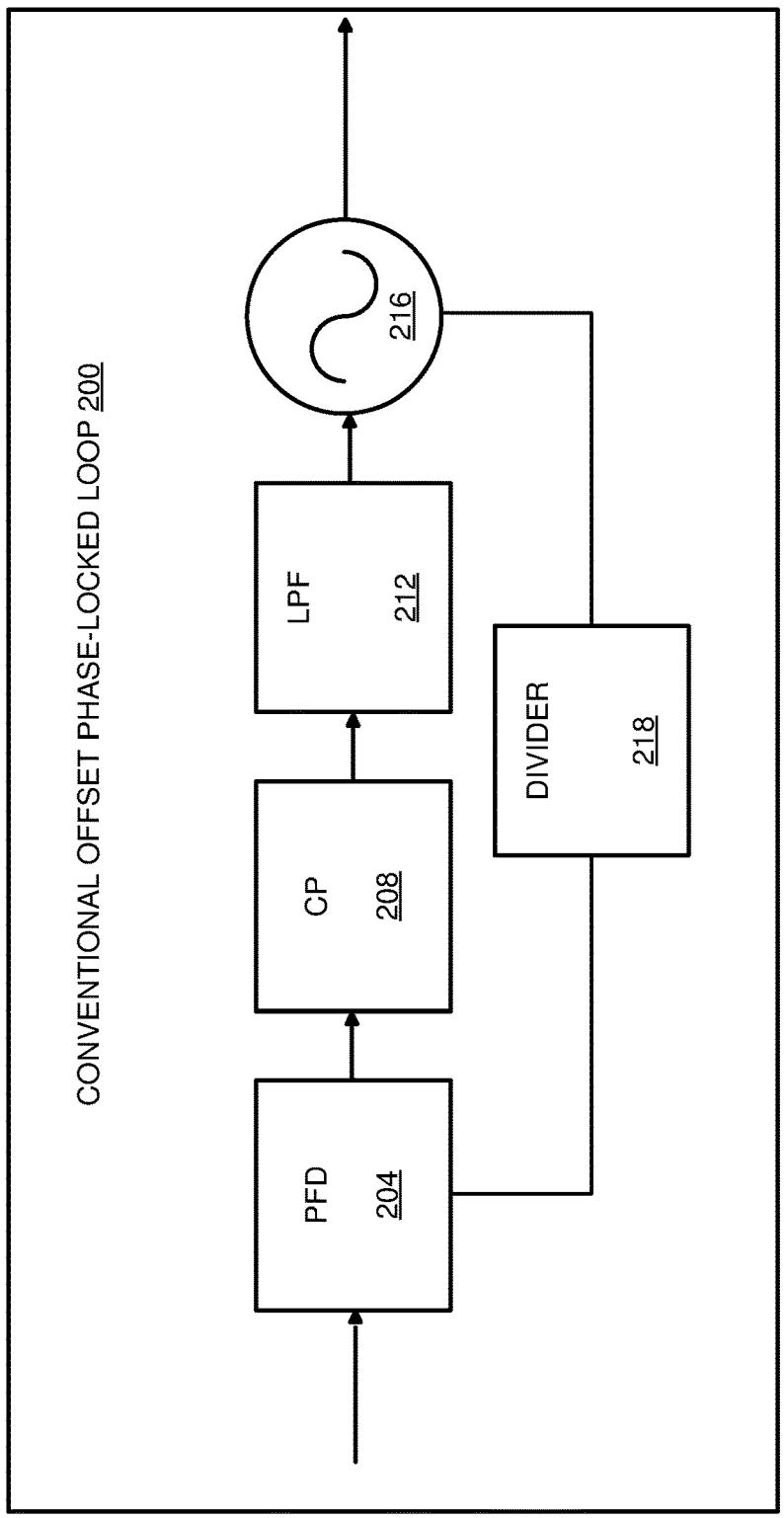
FIG. 2 is a diagram illustrating a basic Phase-locked Loop (PLL) feedback system.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The technology disclosed herein in one embodiment is directed toward systems and methods for providing automatic and continuous tuning of a radio frequency transmitter using a phase-locked loop (PLL). In further embodiments, the disclosed technology may be directed toward solutions to provide sliding high-Q filter functionality for both narrowband and wideband modulation. Embodiments of the technology may also be directed toward systems and methods for providing signal transmission at desired frequencies without the need for matching circuitry common to traditional transmitter architectures. In still further embodiments, the technology may be directed toward systems and methods for providing a reduction in signal power losses common between the signal input and the antenna in traditional transmission systems.

According to various embodiments of the disclosed technology, an offset phase-locked loop can be configured to receive an input signal, upconvert and transmit a radio frequency signal representing the input signal. The offset phase-locked loop transmitter can include a phase-frequency detection circuit configured to receive an input signal from one or more sources for ultimate transmission. The phase/frequency detector can also receive a downconverted voltage-controlled oscillator signal, which can be compared to the input signal. A charge pump receives the output of the phase/frequency detector and converts it into a corresponding output current. This output current is proportional to the offset detected by the phase/frequency detector. A low-pass filter receives the output signal from the charge pump and removes unwanted noise. A voltage-controlled oscillator receives the signal from the filter and converts it into an RF signal for transmission.

The offset phase-locked loop also includes a feedback loop that includes a mixer to downconvert the RF signal to an intermediate frequency signal for comparison at the phase/frequency detector. A low-pass filter can also be included in the feedback path to remove unwanted noise from the feedback signal.

In some embodiments, the voltage-controlled oscillator uses the antenna of the transmitter as an inductive element of its LC tank circuit. Because of the antenna's integration into the voltage-controlled oscillator, a significant amount of signal power may be preserved through the transmission path; the phase-locked loop can itself operate as the transmitter; modulation can occur entirely within the offset phase-locked loop system and can support narrowband and wideband modulation; the radio frequency signal can be continuously and automatically tuned, taking into account impedance changes of the antenna as well as offset from passive components. Accordingly, in various embodiments an impedance matching network is not needed between the amplifier and the antenna.

Figure 4:
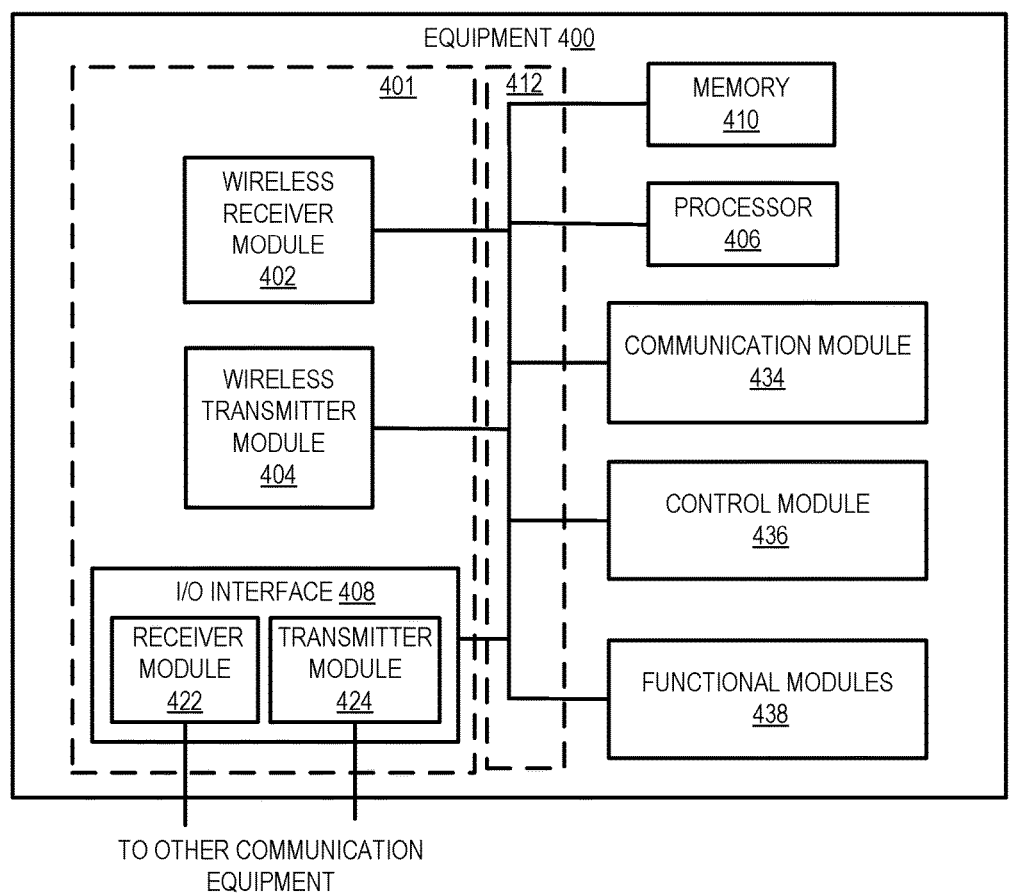
FIG. 4 is a block diagram illustrating one example of equipment with which embodiments of the technology disclosed herein can be implemented.

Before describing the technology in further detail, it is useful to describe an example piece of equipment with which the technology can be implemented. After reading this description, one of ordinary skill in the art will appreciate that the technology disclosed herein can be used with any of a number of different devices or equipment having wireless communication capabilities. FIG. 4 is an example of a piece of equipment having both wired and wireless communication interfaces. In the example of FIG. 4, equipment 400 includes a communication module 401, a processor 406 (which can include multiple processors or processing units), and memory 410 (which can include memory units or modules of different types). These components are communicatively coupled via a bus 412 over which these modules may exchange and share information and other data. Communication module 401 includes wireless receiver module 402, a wireless transmitter module 404, and an I/O interface module 408.

The wireless receiver module 402 and wireless transmitter module 404 each include one or more antennas. The wireless transmitter module 404 is used by equipment 400 to transmit radio signals wirelessly to wireless equipment with which it is communicatively connected. These outbound radio frequency signals can include information of almost any sort that is sent by equipment 400 to other entities. For example, in the case of a multifunction peripheral (MFP) this can include files representing scanned images or documents, log information, housekeeping information, or other information sent by the MFP relating to its operation. As another example, in the case of a camera, this outbound information can include image files and related data (including metadata) sent by the camera to a computer, printer, or other device.

The wireless receiver module 402 is used by equipment 400 to receive radio signals from various wireless terminals within its reception range. Received signals can include information from other equipment used for operation of equipment 400. Continuing with the above two examples, in the case of an MFP, inbound information received by wireless receiver module 402 can include, for example, files to be printed or faxed by the MFP. In the case of a camera, information received could be firmware updates, control information, or other information used by the camera.

The wireless communications implemented using communication module 401 can be implemented according to a number of different wireless protocols, including standardized protocols. Examples of such standardized protocols include Bluetooth®, HiperLan, and various IEEE 802.11 communications standards, although other communication interfaces (whether or not standardized) can be implemented.

An I/O interface module 408 is provided in the illustrated example, and can be configured to couple equipment 400 to other network nodes. These can include nodes or equipment. In this example architecture, the I/O interface module 408 includes a receiver module 422 and a transmitter module 424. Communications via the I/O interface module can be wired or wireless communications, and the transmitter and receiver contained therein can include line drivers and receivers, radios, antennas or other items, as may be appropriate for the given communication interfaces. Transmitter module 424 may be configured to transmit signals that can include voice, data and other communications. These may be sent in a standard network protocol if desired. Receiver module 422 is configured to receive signals from other equipment. These signals can include voice, data and other communications from the other equipment, and can also be received in a standard network protocol if desired. In terms of the above examples of an MFP or digital camera, I/O interface 408 can provide a hardwired complementary interface to the wireless interface described above. This may be, for example, an Ethernet interface, a USB interface, a FireWire interface, or other hardwired interface.

Memory 410, can be made up of one or more modules of one or more different types of memory, and in the illustrated example is configured to store data and other information 424 as well as operational instructions that may be used by the processor to operate equipment 400. The processor 406, which can be implemented as one or more cores, CPUs, DSPs, or other processor units, for example, is configured to execute instructions or routines and to use the data and information in memory 410 in conjunction with the instructions to control the operation of the equipment 400. For example, image-processing routines, such as compression routines, can be stored in memory 410 and used by processor 406 to compress image files from raw files into JPEG files.

Other modules can also be provided with the equipment 400 depending on the equipment's intended function or purpose. A complete list of various additional components and modules would be too lengthy to include, however a few examples are illustrative. For example, a separate communication module 434 can also be provided for the equipment to manage and control communications received from other entities, and to direct received communications as appropriate. Communication module 434 can be configured to manage communication of various information sent to and received from other entities. Communication module 434 can be configured to manage both wired and wireless communications.

A separate control module 436 can be included to control the operation of equipment 400. For example, control module 436 can be configured to implement the features and functionality of equipment 400. Functional modules 438 can also be included to provide equipment functionality. For example, in the case of an MFP, various modules (which may include various forms of hardware and software) can be provided to perform printing, scanning, faxing, and copying operations of the device. In the case of a digital camera, functional modules 438 can include modules such as, for example, optical systems, image capture modules, image processing modules, and so on. Again, as these examples illustrate, one of ordinary skill in the art will appreciate how other modules and components can be included with equipment 400 depending on the purpose or objectives of the equipment.

Having thus described an example application, the technology disclosed herein may from time-to-time described herein in terms of this example application. Description in terms of this environment is provided to allow the various features and embodiments of the invention to be portrayed in the context of an exemplary application. After reading this description, it will become apparent to one of ordinary skill in the art how the invention can be implemented in different and alternative environments and applications.

In various embodiments, an offset phase-locked loop is included in the transmitter and comprises of a phase/frequency detector, charge pump, loop filter, voltage-controlled oscillator, downconverting mixer, and output filter. It uses a mixer to downconvert the RF signal generated by the voltage-controlled oscillator (VCO) to an IF frequency for phase comparison.

Figure 5:
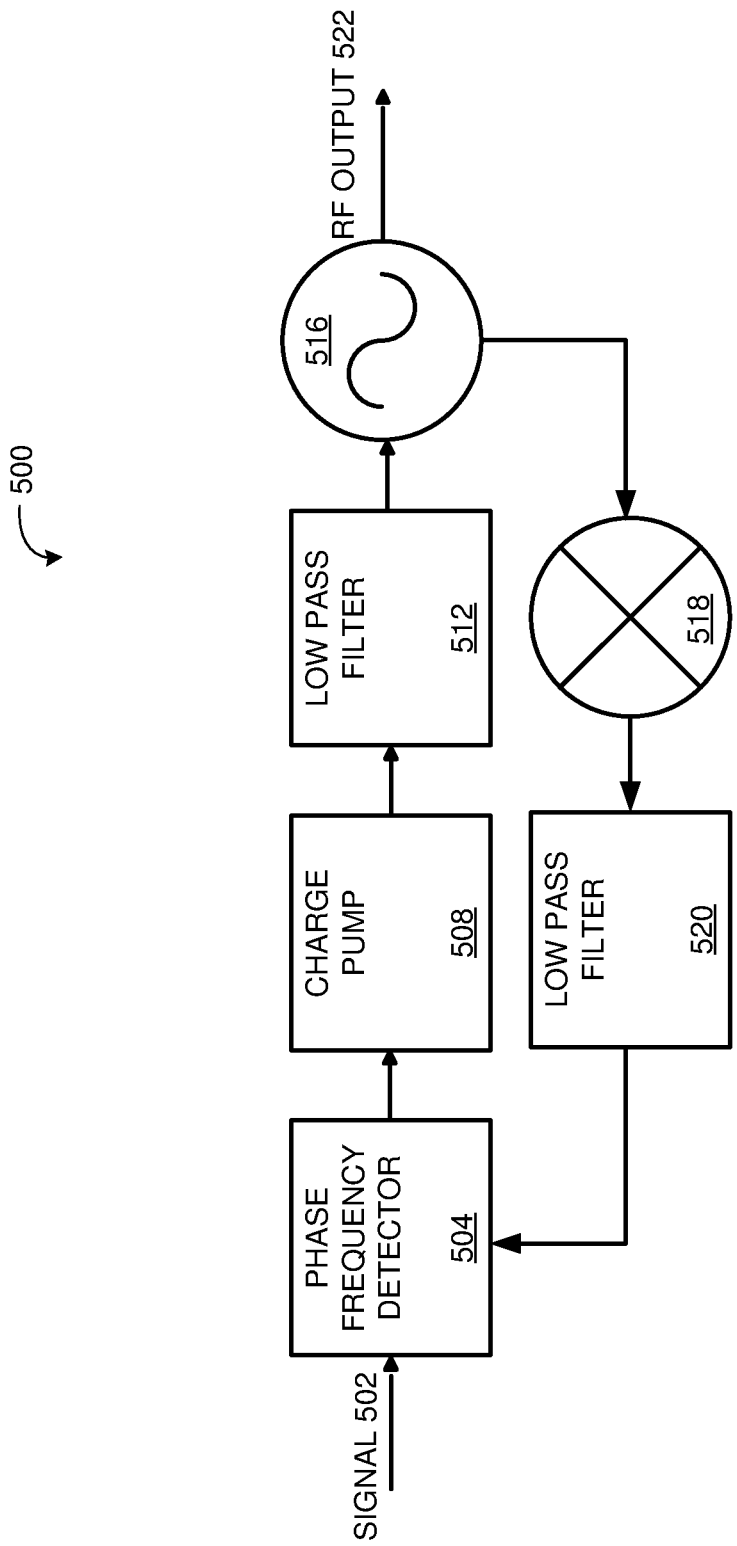
FIG. 5 is a diagram illustrating one example of an offset PLL transmitter with which embodiments of the technology disclosed herein can be implemented.

FIG. 5 is a block diagram illustrating an example implementation of an offset PLL transmitter in accordance with one embodiment of the technology disclosed herein. Referring now to FIG. 5, the offset PLL transmitter (PLL) 500 comprises at least one phase frequency detector (PFD) 504, charge pump (CP) 508, low-pass filter (LPF) 512, and voltage-controlled oscillator (VCO) 516. The reference signal 502 is received by the phase/frequency detector 504 where the phase of the reference signal is detected. The PFD 504 compares the phase of the reference signal with a previously generated RF signal. The PFD 504 determines the phase offset, if any, between the two signals and generates a signal that is proportional to the phase offset. The CP 508 receives the offset signal generated by the PFD 504 and provides additional charge to LPF 512 to correct for any offset. The signal passes from CP 508 to LPF 512 where unwanted noise is filtered out of the signal stream. The signal then passes from the LPF 512 into the VCO 516 network. In the VCO 516 network, radio frequency oscillations are generated as the LC tank within the VCO 516 resonates, and a carrier signal is created in proportion to the voltage passed from the LPF 512. Also at the VCO 516, reference signal modulation is transferred to the generated carrier signal, and an resultant modulated RF signal 522 is generated. The RF signal generated at the VCO 516 is coupled to the feedback loop where the signal is down-converted by a mixer 518 and again filtered at the LPF 520 to reduce noise as well as unwanted high-frequency output signals. The down-converted and filtered signal is provided back to the PFD 504 for phase detection and correction. The RF signal 522 is also radiated directly from an antenna integrated within the VCO 516 circuitry.

The offset phase-locked loop in this example operates similarly to the traditional phase-locked loop except it replaces the divider in the feedback path with a downconverting mixer 518 and second low-pass filter 520. The mixer 518 shifts the output phase of the voltage-controlled oscillator 516 while the second low-pass filter 520 removes any unwanted high-frequency signals generated by the mixer. The stability of the feedback loop is still a concern with the offset phase-locked loop. In operation, the voltage-controlled oscillator 516 receives an input voltage from the output of the low-pass filter 512 and resonates at a frequency related to the input voltage, thereby generating an electromagnetic signal at the desired frequency.

The PLL and its feedback loop continuously adjust the downconverted RF signal to track the reference signal. This drives the frequency of the voltage-controlled oscillator $f_{RF}$ to equal $$f_{RF} = f_{LO} - f_{REF}.$$

This also dictates the IF reference frequency $f_{REF}$ since it must equal $f_{LO} - f_{RF}$. Choosing the LO frequency $f_{LO}$ such that $$f_{LO} = \frac{k+1}{k} f_{RF}$$

and setting k to an integer value, greatly simplifies the transmitter structure; the IF reference frequency $f_{REF}$ now simply equals $f_{LO}/k$.

The phase/frequency detector compares the phase of the IF reference and feedback signals. It analyzes any phase difference and drives the charge pump plus the voltage-controlled oscillator to align the signals.

The phase/frequency detector and the offset PLL drive the RF signal to follow the reference signal. As such, it is possible to apply modulation to the reference signal that maps directly to the RF output. The modulation signal is limited however to the bandwidth of the PLL loop filter. Fortunately, the offset PLL can be designed to support a high IF frequency and a wide bandwidth loop filter.

Figure 6:
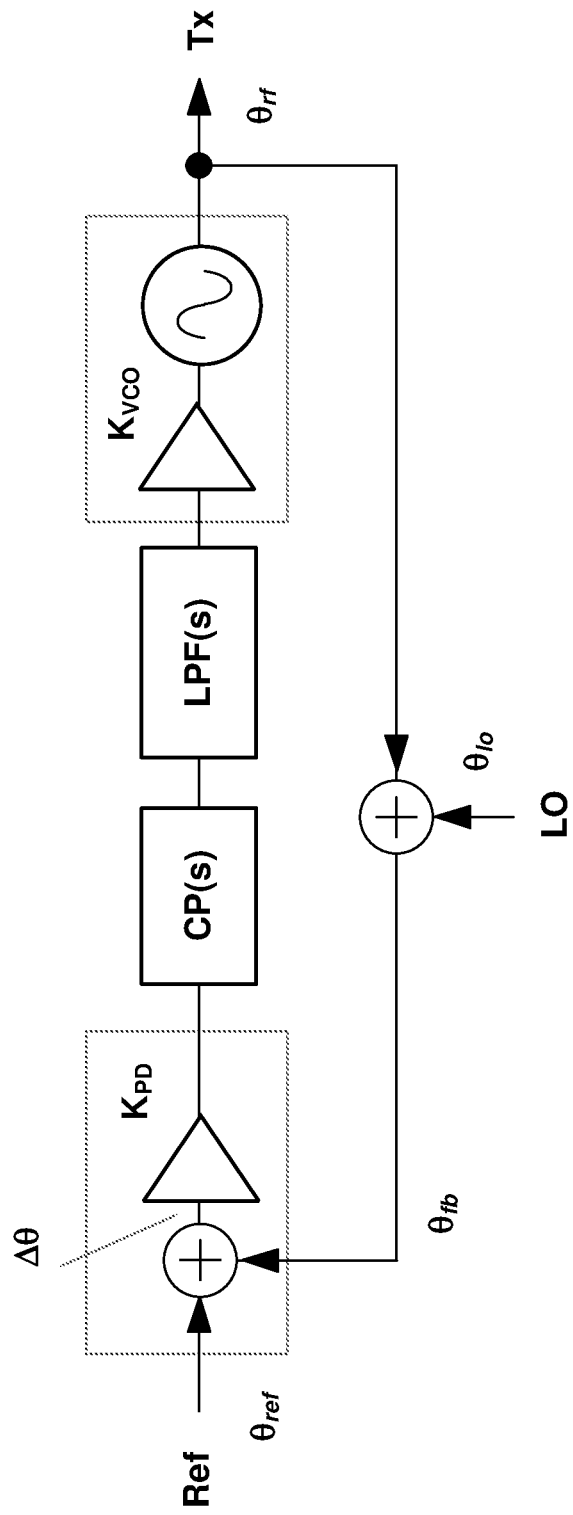
FIG. 6 is a diagram illustrating a mathematical model for the offset PLL transmitter of FIG. 5.

FIG. 6 shows a mathematical model of an offset phase-locked loop. The voltage-controlled oscillator produces an output signal at a frequency set by the control voltage $v_{ctrl}$ according to $$v_{out}(t) = A_c \cos(\omega_{free} t + K_{vco} \int v_{ctrl}(t) dt)$$

where $\omega_{free}$ is the free-running frequency of the oscillator and $K_{vco}$, is its associated gain.

The gain $K_{vco}$, describes the relationship between the excess phase of the carrier $\Phi_{out}(s)$ and the control voltage $v_{ctrl}$ $$\frac{\Phi_{out}(s)}{v_{ctrl}(s)} = \frac{K_{vco}}{s}$$

where $K_{vco}$ is in radians/V. When the phase-locked loop is locked, the phase detector and charge pump circuits generate an output signal $i_{CP}(s)$ that is proportional to the phase difference $\Delta\theta$ between the two signals input to the phase detector. The output signal $i_{CP}(s)$ can therefore be expressed as $$i_{CP}(s) = K_{pd} \frac{\Delta\theta(s)}{2\pi}$$

where $K_{pd}$ is in Amps/radians and $\Delta\theta$ is in radians.

Figure 7:
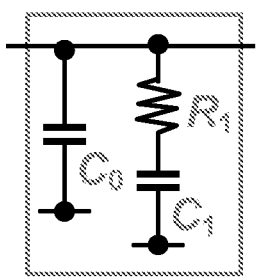
FIG. 7 is a diagram illustrating a simple integration or loop filter, which includes resistor $R_1$ and capacitors $C_1$-$C_2$.

FIG. 7 is a diagram illustrating a simple integration or loop filter, which includes resistor $R_1$ and capacitors $C_1$-$C_2$, that transform the signal $i_{CP}(s)$ to the control voltage $v_{ctrl}$ as follows $$v_{ctrl}(s) = i_{out}(s) \left( \frac{sR_1 C_1 + 1}{s^2 R_1 C_1 C_2 + s(C_1 + C_2)} \right)$$

where a zero (at $1/R_1 C_1$) has been added to stabilize the second order feedback system and the capacitor $C_2$ has been included to reduce any ripple on the output voltage.

Combining the above relations yields the composite open-loop transfer function $$GH(s) = K_{PD} K_{VCO} \frac{1}{s} \left( \frac{sR_1 C_1 + 1}{sR_1 C_1 C_2 + (C_1 + C_2)} \right),$$

which has two poles at the origin (due to the voltage-controlled oscillator and the integration filter). This system is referred to as a type II phase-locked loop.

The open-loop transfer function GH(s) may be used to analyze the stability of the feedback loop. Ideally, the phase margin approaches 45°, providing a loop with adequate stability while minimizing acquisition time.

The loop gain of the phase-locked loop (that is, the gain of the phase-locked loop near dc) depends on three parameters ($I_{CP}$, $K_{vco}$, and $R_1$)

$$G_{loop} = |GH(s)|_{s \to dc} \approx I_{CP} R_1 K_{VCO},$$

and approximately equals the unity-gain bandwidth of the system.

To improve stability, the integration filter's zero shifts the phase slightly before the system's unity gain frequency. The closed-loop response of the system can be written as $$T(s) = \frac{K_{PD} K_{VCO}(sR_1 C_1 + 1)}{s^3 R_1 C_1 C_2 + s^2(C_1 + C) + sK_{PD} K_{VCO} R_1 C_1 + K_{PD} K_{VCO}}.$$

This shows the zero and two complex poles. Not surprisingly, both the open-loop and closed-loop responses of the phase-locked loop depend on the integration filter components ($R_1$, $C_1$-$C_2$), the charge pump current $I_{CP}$, and the gain of the voltage-controlled oscillator, $K_{vco}$.

The roots of the transfer function shape the unity-gain bandwidth and set the phase margin of the feedback system. In some embodiments, the unity-gain bandwidth is configured to be at least equal to one-half the bandwidth of the modulated signal. In this application, the bandwidth of the continuous-phase BFSK-modulation signal is 13.5 MHz. In addition, the phase margin must exceed 45° to ensure stability.

Figure 3:
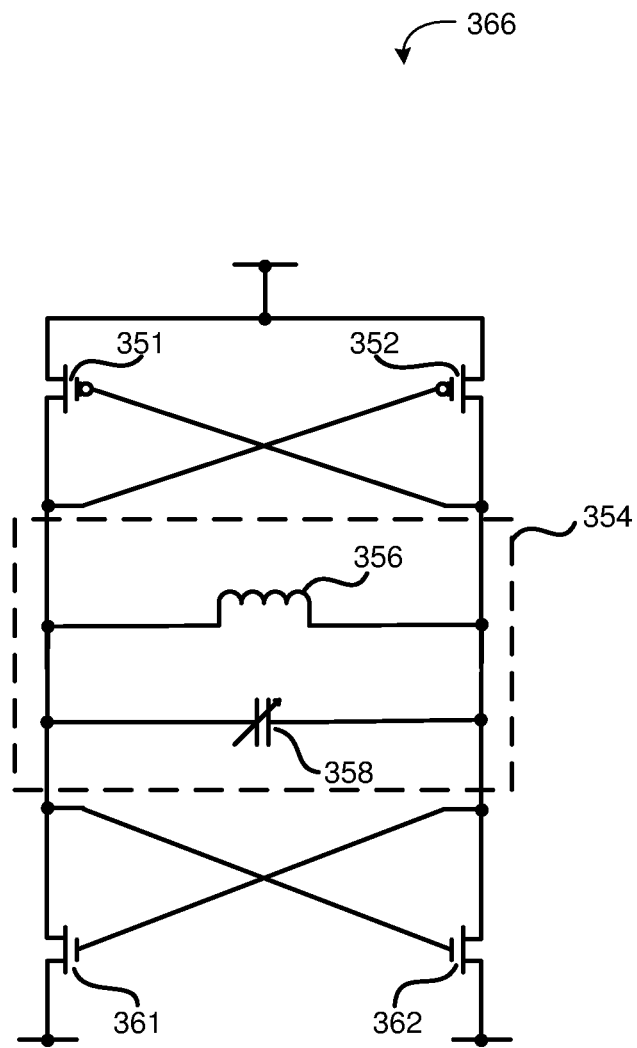
FIG. 3 is a diagram illustrating a basic LC Voltage Controlled Oscillator (VCO).

The VCO topology typically employed in integrated circuit technology is the cross-coupled LC-resonant gm-compensated structure shown in FIG. 3. As described above, the parallel-LC tank sets the frequency of oscillation. However, embodiments can be implemented with an enhanced VCO architecture. More particularly, in some embodiments, the LC tank circuit can be configured with the antenna incorporated therein, providing the inductive component in series or parallel with the capacitive element.

Figure 8:
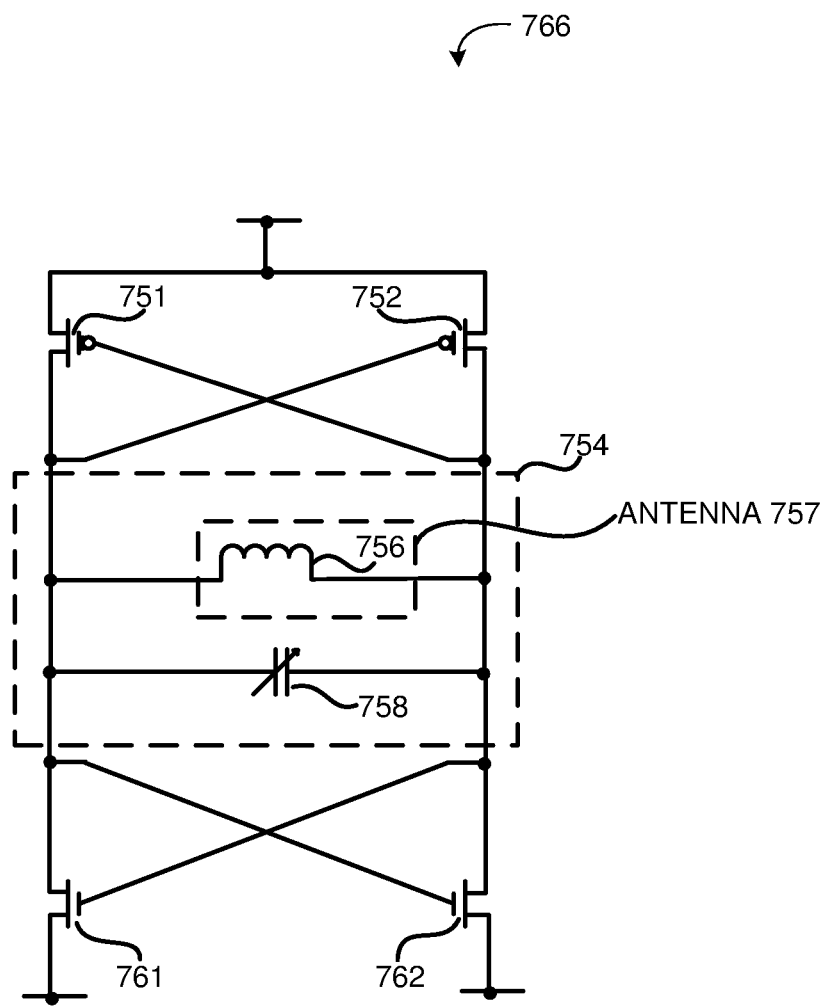
FIG. 8 is a diagram illustrating one example of a LC Voltage Controlled Oscillator (VCO) with which embodiments of the technology disclosed herein can be implemented.

FIG. 8 is a diagram illustrating an example implementation of a modified Voltage-Controlled Oscillator (VCO) 766 in accordance with one embodiment of the technology disclosed herein. The Voltage-Controlled Oscillator (VCO) in this example includes p-type transistors 751 and 752, n-type transistors 761 and 762, and LC tank circuit 754. As previously described, LC tank circuit 754 sets the frequency of oscillation, and the transistors 751, 752, 761 and 762 add energy to the tank to replenish losses due to non-ideal and unwanted parasitic elements. LC tank circuit 754 includes an inductive element 756 and a capacitive element 758 (e.g., a variable capacitor) connected in parallel. In other embodiments, the inductive and capacitive elements could be connected in series.

Because the active devices in the voltage-controlled oscillator 766 replenish any losses, it is possible to bias these devices in class A, B, or C mode. Class C operation limits the operating current and improves efficiency. Moreover, the tuned LC tank 754 attenuates unwanted harmonics produced by class C operation.

The example illustrated in FIG. 8 utilized the transmitter's antenna 757 as the inductive element 756 in the LC tank circuit 754. In some embodiments, the antenna can provide the entire inductive value used for LC tank circuit 754, while in other embodiments, additional inductance can be added by including one or more inductive elements with antenna 757 in LC tank circuit 754. Although the illustrated example shows a parallel LC tank circuit, one of ordinary skill in the art will recognize that LC tank circuit 754 can include various configurations and combinations of inductive and capacitive loads, in series or in parallel, without departing from the spirit of the disclosed technology herein.

Integrating the antenna inductance into the VCO circuit can, in various applications, lead to a high-Q resonator and significant radiated power. This can be an arrangement for a radio transmitter with modest output power. The quality factor Q maps to the energy losses in the LC tank circuit and voltage-controlled oscillator as follows $$Q = \frac{\varepsilon_{stored}}{\varepsilon_{lost}}$$

where ε represents energy.

An LC tank circuit using the antenna inductance can provide, for example, a Q of approximately 40-50. It follows that the higher Q corresponds to less energy lost and leads to a more efficient output stage. Accordingly, embodiments can be implemented to eliminate the matching network that is otherwise essential to a transmitter architecture with an amplifier output as well as a back-termination resistor and its losses. As a result, the VCO makes a significantly more efficient output circuit.

In various embodiments, the LC tank circuit is configured to resonate at the frequency of the RF signal. This frequency may be set by the PLL feedback loop and reference input. More importantly, the LC tank circuit may be configured such that its resonant frequency follows the frequency of the reference signal. This results in a sliding high-Q filter at the RF output that is continuously and automatically tuned. As a result, the offset PLL transmitter obtains and then maintains its alignment even with process variations, supply changes, component drift, and antenna impedance shifts.

As input voltage is applied across variable capacitor 758, current flow within the LC tank circuit 754 generates oscillations at a resonant frequency in proportion to the input voltage. Accordingly, modulation of the reference signal is passed to the carrier signal generated at the VCO 766 and the LC tank produces a modulated RF signal. The antenna 757 incorporated as the inductive load 756 of the LC tank 754 radiates the RF signal generated by the LC tank as the oscillations occur.

As noted above, antenna 757 can be implemented as the sole inductive component of LC tank 754, or it can be included with additional inductive or capacitive elements to achieve the desired inductance. Additionally, variable capacitor 758 can be implemented as the sole capacitive component of LC tank 754, or it can be included with additional capacitive elements to achieve the desired capacitance.

As explained previously, because the PLL loop naturally drives the error at the phase/frequency detector output to zero, the antenna's impedance fluctuations are also naturally corrected for because it is incorporated as part of the VCO 766 network within the PLL. Being incorporated directly into the VCO 766, the antenna 757 radiates an RF signal that is automatically and continuously tuned by the PLL loop. Accordingly, modulation of the reference signal is transferred to the VCO 766. Thus, the offset PLL transmitter 500 acts like a sliding filter (continuously shifting its resonant frequency to match the modulated frequency of the reference signal). Accordingly, the offset PLL transmitter 500 may be implemented to be compatible with narrowband and wideband modulation. Moreover, signal power is preserved because the matching network circuitry is eliminated when the antenna is moved to the VCO 766.

With the antenna 757 incorporated directly into the LC tank 754 circuitry of the VCO 766, the power losses normally seen because of the additional matching network are eliminated. The result is a sliding, high-efficiency, high-Q resonator compatible with narrowband and wideband modulation applications.

According to various embodiments of the disclosed technology, an offset PLL transmitter can be used as a sliding, high-efficiency, high-Q radio frequency transmitter with several advantages over traditional transmitters used in radio frequency transmission. Because modulation of the reference signal can be transferred to the VCO 766, and because the RF signal radiated at the antenna 754 within the VCO 766 follows the phase and frequency of the reference signal being tracked as part of the PLL loop operation, the offset PLL transmitter 500 can act, in various embodiments, as a sliding, high-efficiency, high-Q filter capable of narrowband and wideband modulation.

Figure 10:
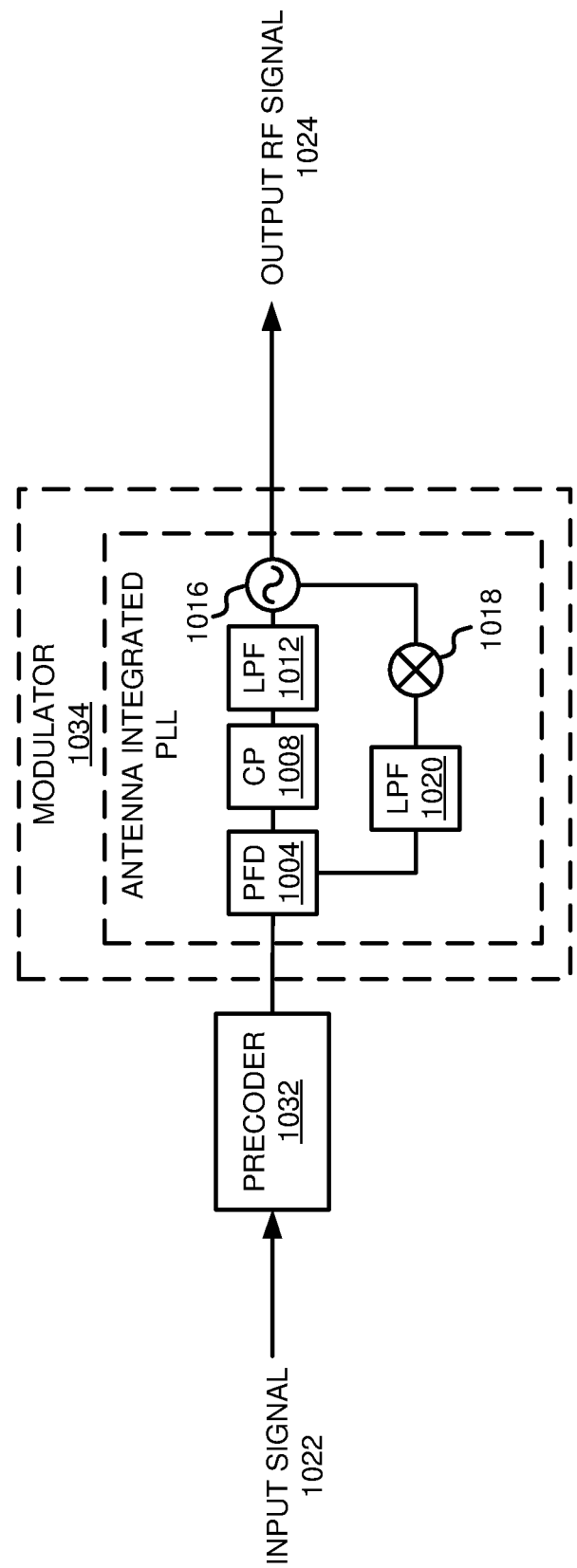
FIG. 10 is a diagram illustrating an example transmitter having an offset PLL transmitter, an antenna integrated into the VCO, and no matching network.

FIG. 9 is a diagram illustrating a conventional transmitter with a conventional PLL and matching network. FIG. 10 is a diagram illustrating a transmitter using an offset PLL with an enhanced VCO to avoid a matching network. As can be seen in FIG. 9, the system still utilizes a power amplifier 936 coupled with a matching network 937 to interface with the antenna 938 to transmit the radio frequency signal 924. In contrast, the example transmitter in FIG. 10 incorporates an offset PLL transmitter circuit with the modified VCO. That is, the VCO 1016 of the PLL depicted in FIG. 10 has incorporated the antenna into the LC tank circuit of VCO 1016.

Moving the antenna into the VCO 1016 in various embodiments eliminates the power amplifier 936 and matching network 937 altogether. Accordingly, because of the antenna's integration into the VCO 1016, a significant amount of signal power may be preserved through the transmission path; the PLL can itself operate as the transmitter; modulation can occur entirely within the offset PLL system and can support high-Q narrowband and wideband modulation; the radio frequency signal 1024 can be continuously and automatically tuned, taking into account impedance changes of the antenna as well as offset from passive components.

There are many factors that affect the impedance of the various elements in a transmission system, which can give rise to an impedance mismatch. For example, the impedance characteristics of the antenna and other elements in a transmission system may vary considerably with the frequency of the signal being transmitted or with changes in the natural surroundings of the antenna (e.g. position relative to conducting surfaces, shielding by absorption bodies, rapid temperature changes, etc.). All these factors can give rise to an impedance mismatch, resulting in the power losses and transmission errors already mentioned.

Because, in various embodiments, the antenna becomes part of the PLL, any changes in the antenna's impedance will be automatically and continuously tracked, and thereby automatically and continuously tuned to the radio frequency signal being generated by the VCO. In other words, impedance changes in the antenna are taken into account automatically with the regular operation of the PLL. Thus, there is no need for additional matching network circuitry to compensate for these changes because any impedance changes are being monitored and corrected for by the regular operation of the PLL.

In further embodiments, the technology may be directed toward solutions for mapping signals onto high-Q narrowband and wideband transmission networks. Embodiments compatible with wideband transmission can be configured to include capacitor calibration, VCO coarse tuning and $K_{VCO}$ calibration. Such calibration may be necessary to reduce distortion or improve feedback stability by correcting for component variation of on-chip passive elements.

In various embodiments of the disclosed technology, the offset PLL transmitter can further include a plurality of low-pass filters to further eliminate signal noise and transmission errors. In one such embodiment depicted in FIG. 5, a low-pass filter operates on the signal as it passes between the charge pump element and the voltage-controlled oscillator, and another low-pass filter operates on the signal as it passes between the mixer element in the feedback loop and the PFD element. It will be apparent to one of ordinary skill in the art after reading this description that a fewer or greater number of low-pass filters and other elements may be incorporated without departure from the disclosed technology. Indeed, one of ordinary skill in the art will recognized that the illustrated embodiments and their various alternatives can be implemented without confinement to the illustrated examples. For example, descriptions of particular arrangements of elements should not be construed as restricting to or mandating a particular architecture or configuration.

According to various embodiments of the disclosed technology, with the antenna's inductive load integrated into the LC tank of the VCO, the output power of the transmitter can be conveniently controlled. This is accomplished by adjusting the supply voltage connected to the VCO or a resistance shunted across the LC tank.

In accordance with various embodiments of the disclosed technology, the VCO can further comprise additional muting circuitry configured to enable power ramping and to control VCO voltage swings. Such configurations can reduce spurious emissions caused by abrupt transmission power variations, which can arise from various calibration processes, RF transmission mode switching, or otherwise. Embodiments may also be configured to control the power radiated by the VCO when the antenna is integrated as part of its LC tank.

As noted above with reference to FIG. 8, the quality factor Q is related to the energy losses and resistance. This can be shown as $$Q = \frac{R_p}{X_L} = \frac{\varepsilon_{stored}}{\varepsilon_{lost}}$$

where $R_p$ is the resistance, $X_L$ corresponds to the reactance of the antenna inductance, and represents the energy in the tank.

Figure 11:
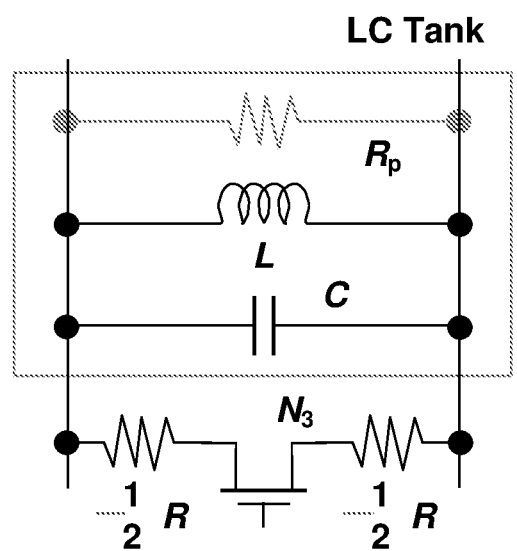
FIG. 11 is a diagram illustrating an example of a modified LC tank with VCO muting in accordance with various embodiments of the technology disclosed herein.

It is possible to reduce the output signal swing of the voltage-controlled oscillator by increasing the energy losses in the LC tank. This is equivalent to reducing resistor $R_p$ and may be accomplished in various embodiments using a resistor. An example of this is shown in FIG. 11, which illustrates an example of a modified LC tank with VCO muting. In this example, transistor $N_3$ acts as a switch. The VCO output swing now becomes $$A = i_{gm} \frac{RR_p}{R + R_p} \approx i_{gm} R$$

The radiated power level $A^2$ tracks the VCO signal swing, which depends on the value of resistance R.

It is also possible to ramp the VCO output power by controlling the value of the resistance, R. An example configuration that can be used to control the output power is shown in FIG. 12.

Figure 12:
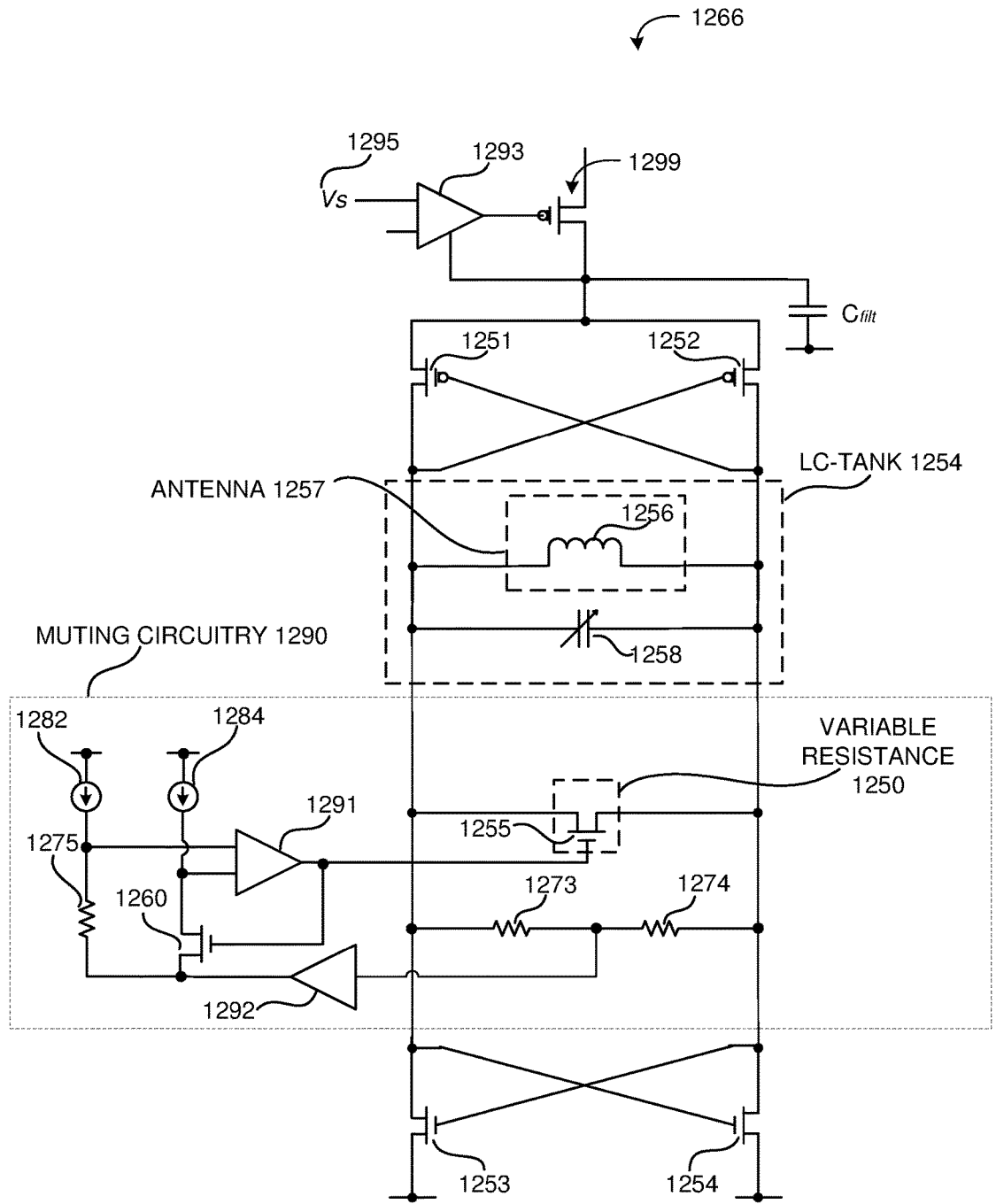
FIG. 12 is a diagram illustrating an example LC Voltage Controlled Oscillator (VCO) employing example VCO muting circuitry to enable power ramping and control of VCO voltage swings in accordance with various embodiments of the technology disclosed herein.

FIG. 12 is a diagram illustrating an example LC Voltage Controlled Oscillator (VCO) employing example VCO muting circuitry, which can be used in various embodiments to enable power ramping and control, and to reduce VCO voltage swings. The antenna-integrated LC VCO 1266 in this example includes cross-coupled transistors 1251 and 1252, and cross-coupled transistors 1253 and 1254. The antenna-integrated LC VCO 1266 also includes an antenna 1256 and variable capacitor 1258 connected in parallel, similar to the configuration shown in the example VCO of FIG. 8. The example VCO of FIG. 11 further includes muting circuitry 1290, which in this example comprises transistors 1255 and 1260, resistors 1273, 1274, and 1275, operational amplifiers 1291 and 1292, and current sources 1282 and 1284.

VCO 1266 receives an input voltage 1295. The input voltage 1295 drives operational amplifier 1293 and associated transistor 1299. This circuitry is connected in a feedback loop to drive the voltage at the drain of transistor 1299 equal to the input voltage 1295. As a result, the input voltage is seen at the sources of cross-coupled transistors 1251 and 1252. This voltage biases the LC tank circuit 1254. The LC tank circuit 1254 is constructed to oscillate at a frequency determined by the parallel combination of inductance 1256 and variable capacitance 1258. The capacitance of variable capacitor 1258 varies in proportion to input voltage 1259.

Transistor 1255 applies a resistance in parallel to the LC tank circuit 1254, and the amount of drain-source resistance can be varied by varying the voltage supplied to the gate of transistor 1255. The drain-source resistance supplied by transistor 1255 imposes a desired energy loss on the LC tank circuit 1254. Accordingly, the output power of the VCO can be controlled by controlling the resistance applied by transistor 1255. Controlling the resistance can also suppress spurious emissions.

In the example of FIG. 12, the resistance across transistor 1255 is varied in proportion to the controlled current ratio between current sources 1282 and 1284. In operation, operational amplifier 1291 drives the gate bias of transistor 1260, which controls the drain-source resistance of transistor 1260. This can be shown by the relationship:

$$I_1 R_1 = I_5 r_{ds5},$$

where $I_1$ is the current generated by current source 1282, $R_1$ is the resistance of resistor 1275, $I_5$ is the current generated by current source 1284, and $r_{ds5}$ is the drain-source resistance of transistor 1260. In various embodiments, transistor 1260 is configured like transistor 1255, with similar bias conditions. Note that operational amplifier 1292 buffers the common-mode voltage passing to transistor 1260 and its accompanying circuitry.

Similarly, operational amplifier 1291 drives the gate bias of transistor 1255 to produce a drain-source resistance at transistor 1255 approximately equal to the drain-source resistance of transistor 1260, producing the variable resistance desired in the circuit. In particular, the operational amplifier 1291 drives transistor 1255 to display a drain-source resistance that satisfies:

$$I_1 R_1 = I_5 r_{ds4}$$

where $r_{ds4}$ is the drain-source resistance of transistor 1255. Accordingly, the value of the drain-source resistance of transistor 1255 is given by:

$$r_{ds4} = \frac{I_1}{I_5} \cdot R_1.$$

This illustrates one example of circuitry used to control the effective resistance of transistor 1255. In this example, this resistance can be precisely controlled by varying the ratio of the currents supplied by current source 1282 and current source 1284. Therefore, current 1282 and current

1284 can be adjusted to precisely control and/or mute the power output of the VCO during desired intervals (i.e. during the acquisition mode of the PLL). The VCO output power follows the relationship:

$$P_{out} \propto A^2 \approx \left(i_{gm}\frac{I_1}{I_5} \cdot R_1\right)^2,$$

where $P_{out}$ is a measure of the output power of the VCO, A is proportional to the VCO voltage swing, $i_{gm}$ is the current generated by the active devices (e.g. transistors), and $I_1$, $I_5$ and $R_1$ are the same as described previously. In accordance with this relationship, the output power of the VCO 1266 can be programmed—by adjusting the ratio of current sources 1282 and 1284—to ramp-up or ramp-down the transmission signal power. Power-ramping functionality can be used to provide a smooth power profile (e.g. Hanning Window) at the VCO 1266 and antenna 1257.

In various embodiments, maintaining a smooth power profile at VCO 1266 can reduce or eliminate spurious emissions normally caused by more abrupt power changes. The LC tank circuit 1254 generates an RF signal controlled in-whole or in-part by: the supply voltage 1295, the capacitance of variable capacitor 1258, the inductive load of the antenna 1257 (i.e., as inductor 1256), the variable resistance applied by transistor 1255 as controlled by muting circuitry 1290. Antenna 1257 radiates an RF signal from within the VCO of the offset PLL transmitter and the signal transmission is characterized by a smooth power ramping profile (e.g. Hanning window).

According to various embodiments of the disclosed technology, the output power profile of the VCO 1266 can be controlled, and when necessary can be suppressed during different intervals of the offset PLL transmitter operation-whether the PLL is operating in acquisition mode, switching between acquisition and tracking modes, or turning on/off in a manner that produces changes in output power. In accordance with various embodiments of the disclosed technology, the VCO 1266 output power profile can be controlled by varying a resistive load 1250 integrated in parallel with the LC-Tank 1254 circuitry. Calculated increases or decreases in the resistance displayed by such a resistive load can impose a controlled amount of energy loss in the LC-Tank 1254. Accordingly, in various embodiments of the disclosed technology, controlled energy losses in the LC-Tank 1254 can be used to reduce VCO 1266 voltage swings. Reducing the magnitude of VCO 1266 voltage swings can avoid spurious emissions during acquisition or caused by changes in transmission signal power.

In still further embodiments, the muting circuitry 1290 of example VCO 1266 is configured to enable power ramping (i.e. provide control of the ramping profile of the VCO output power) when the PLL switches back into transmission mode. Controlling the power profile at VCO 1266 can avoid the spurious emissions caused by power changes that regularly occur when transmission starts or stops. Accordingly, embodiments implementing the technology disclosed herein can be configured to radiate an RF signal directly from an antenna 1257 incorporated as the inductive load 1256 of the LC-Tank 1254 in the VCO 1266 of a PLL loop, the VCO 1266 output power profile being controlled, in part, by muting circuitry 1290 configured to generate a smooth power profile to avoid spectral splatter (i.e. spurious emissions).

It will be apparent to one of ordinary skill in the art that, without departing from the disclosed technology herein, additional and/or different configurations of current sources, operational amplifiers, transistors and resistors may be incorporated to establish an effective variable resistance module to mute the VCO and/or adjust the VCO output power profile according to the requirements of a particular application. Indeed, one of ordinary skill in the art will recognize that the illustrated embodiments and their various alternatives can be implemented without confinement to the illustrated examples. For example, descriptions of particular arrangements of elements should not be construed as restricting to or mandating a particular architecture or configuration.

Figure 13:
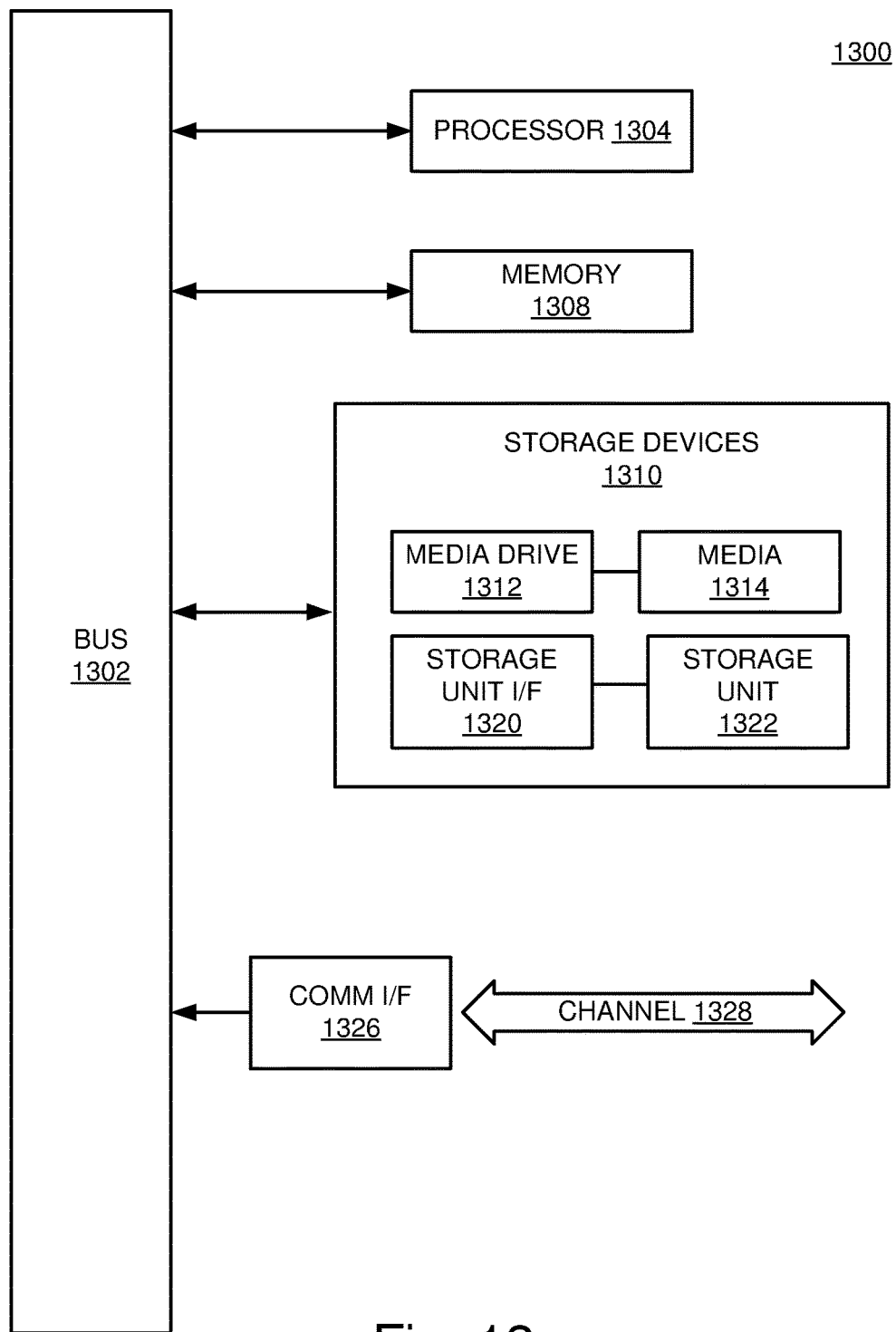
FIG. 13 is a diagram illustrating an example computing module that may be used in implementing various features of embodiments of the disclosed technology.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 13. Various embodiments are described in terms of this example-computing module 1300. After reading this description, it will become apparent to a person skilled in the relevant art how to implement the technology using other computing modules or architectures.

Referring now to FIG. 13, computing module 1300 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1300 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1300 might include, for example, one or more processors, controllers, control modules, or other processing devices, such as a processor 1304. Processor 1304 might be implemented using a general-purpose or special-purpose processing engine such as, for example, a microprocessor, controller, or other control logic. In the illustrated example, processor 1304 is connected to a bus 1302, although any communication medium can be used to facilitate interaction with other components of computing module 1300 or to communicate externally.

Computing module 1300 might also include one or more memory modules, simply referred to herein as main memory 1308. For example, preferably random access memory (RAM) or other dynamic memory, might be used for storing information and instructions to be executed by processor 1304. Main memory 1308 might also be used for storing temporary variables or other intermediate information during execution of instructions to be executed by processor 1304. Computing module 1300 might likewise include a read only memory ("ROM") or other static storage device coupled to bus 1302 for storing static information and instructions for processor 1304.

The computing module 1300 might also include one or more various forms of information storage mechanism 1310, which might include, for example, a media drive 1312 and a storage unit interface 1320. The media drive 1312 might include a drive or other mechanism to support fixed or removable storage media 1314. For example, a hard disk drive, a floppy disk drive, a magnetic tape drive, an optical disk drive, a CD or DVD drive (R or RW), or other removable or fixed media drive might be provided. Accordingly, storage media 1314 might include, for example, a hard disk, a floppy disk, magnetic tape, cartridge, optical disk, a CD or DVD, or other fixed or removable medium that is read by, written to or accessed by media drive 1312. As these examples illustrate, the storage media 1314 can include a computer usable storage medium having stored therein computer software or data.

In alternative embodiments, information storage mechanism 1310 might include other similar instrumentalities for allowing computer programs or other instructions or data to be loaded into computing module 1300. Such instrumentalities might include, for example, a fixed or removable storage unit 1322 and an interface 1320. Examples of such storage units 1322 and interfaces 1320 can include a program cartridge and cartridge interface, a removable memory (for example, a flash memory or other removable memory module) and memory slot, a PCMCIA slot and card, and other fixed or removable storage units 1322 and interfaces 1320 that allow software and data to be transferred from the storage unit 1322 to computing module 1300.

Computing module 1300 might also include a communications interface 1324. Communications interface 1324 might be used to allow software and data to be transferred between computing module 1300 and external devices. Examples of communications interface 1324 might include a modem or softmodem, a network interface (such as an Ethernet, network interface card, WiMedia, IEEE 802.XX (or other interface), a communications port (such as for example, a USB port, IR port, RS232 port Bluetooth® interface, or other port), or other communications interface. Software and data transferred via communications interface 1324 might typically be carried on signals, which can be electronic, electromagnetic (which includes optical) or other signals capable of being exchanged by a given communications interface 1324. These signals might be provided to communications interface 1324 via a channel 1328. This channel 1328 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1308, storage unit 1320, media 1314, and channel 1328. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1300 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A voltage-controlled oscillator (VCO) for a radio transmitter including an antenna, the voltage-controlled oscillator comprising a LC tank circuit, and a muting circuit configured to provide a gradual ramping of a VCO power output; wherein the muting circuit comprises:
   a first transistor including a gate, drain and a source, the first transistor connected to provide a drain-source resistance in parallel with the LC tank circuit;
   a second transistor including a gate, drain and a source, first and second current sources, wherein the second current source is coupled to the source of the second transistor;
   a first operational amplifier having a first input coupled to the first current source and a second input coupled to the second current source, and an output coupled to the gate of the first transistor and to the gate of the second transistor;
   a second operational amplifier having a first input coupled to a voltage divider connected in parallel to the LC tank circuit; and an output coupled to the drain of the second transistor and coupled to the first current source.

2. The voltage-controlled oscillator of claim 1, wherein the LC tank circuit comprises an inductive element and a capacitive element; and wherein the inductive element of the LC tank circuit comprises the antenna.

3. The voltage-controlled oscillator of claim 1, wherein the muting circuit comprises a variable resistance coupled to the LC tank circuit, wherein the variable resistance is configured to be adjusted to control VCO power output.

4. The voltage-controlled oscillator of claim 1, wherein the drain-source resistance of the first transistor is controlled by controlling the voltage supplied to the gate of the first transistor.

5. The voltage-controlled oscillator of claim 1, wherein the drain-source resistance of the first transistor is controlled by controlling the current generated by the first and second current sources.

6. The voltage-controlled oscillator of claim 1, wherein the current supplied by the first and second current sources is adjusted to adjust the drain-source resistance of the first transistor to control VCO power output.

7. The voltage-controlled oscillator of claim 1, wherein the drain-source resistance of the first transistor is proportional to the ratio of currents generated by the first and second current sources such that $$r_{ds4} = \frac{I_1}{I_5},$$

where $r_{ds4}$ is the drain-source resistance of the first transistor, $I_1$ and $I_5$ are the currents generated by the first and second current sources.

8. The voltage-controlled oscillator of claim 1, wherein the muting circuit further comprises a resistor connected in series between the output of the second operational amplifier and the first current source, and wherein the drain-source resistance of the transistor is proportional to the ratio of currents generated by the first and second current sources such that $$r_{ds4} = \frac{I_1}{I_5} \cdot R_1.$$

where $r_{ds4}$ is the drain-source resistance of the first transistor, $I_1$ and $I_5$ are the currents generated by the first and second current sources, and $R_1$ is the resistance of the resistor.

9. A voltage-controlled oscillator for a radio transmitter including an antenna, the voltage-controlled oscillator comprising a LC tank circuit, and a means for controlling the output of the voltage-controlled oscillator; wherein the means for controlling comprises:
   a first transistor including a gate, drain and a source, the first transistor connected to provide a drain-source resistance in parallel with the LC tank circuit;
   a second transistor including a gate, drain and a source, first and second current sources, wherein the second current source is coupled to the source of the second transistor;
   a first operational amplifier having a first input coupled to the first current source and a second input coupled to the second current source, and an output coupled to the gate of the first transistor and to the gate of the second transistor;
   a second operational amplifier having a first input coupled to a voltage divider connected in parallel to the LC tank circuit; and an output coupled to the drain of the second transistor and coupled to the first current source.

10. The voltage-controlled oscillator of claim 9, wherein the LC tank circuit comprises an inductive element and a capacitive element; and wherein the inductive element of the LC tank circuit comprises the antenna.

11. The voltage-controlled oscillator of claim 9, wherein the means for controlling provides a variable resistance connected in parallel with the LC tank circuit, the variable resistance being adjustable to control VCO power output.

12. The voltage-controlled oscillator of claim 9, wherein the means for controlling comprises control circuitry configured to control the effective variable resistance.

13. A radio frequency transmitter, comprising:
   an antenna; and
   an offset phase-locked loop coupled to the antenna and having an input configured to receive an information signal, the phase-locked loop further comprising:

a phase detection circuit including a first input configured to receive the information signal and a second input configured to receive a feedback signal;

a charge pump including an input coupled to the phase detection circuit and an output;

a filter including an input coupled to the output of the charge pump;

a voltage-controlled oscillator coupled to the charge pump, the voltage-controlled oscillator comprising a LC tank circuit, and a muting circuit; wherein the muting circuit comprises:

- a first transistor including a gate, drain and a source, the first transistor connected to provide a drain-source resistance in parallel with the LC tank circuit;
- a second transistor including a gate, drain and a source,
- first and second current sources, wherein the second current source is coupled to the source of the second transistor;
- a first operational amplifier having a first input coupled to the first current source and a second input coupled to the second current source, and an output coupled to the gate of the first transistor and to the gate of the second transistor;
- a second operational amplifier having a first input coupled to a voltage divider connected in parallel to the LC tank circuit; and an output coupled to the drain of the second transistor and coupled to the first current source; and
- a feedback path, the feedback path comprising a downconverter and a filter, the downconverter including an input coupled to the voltage-controlled oscillator, and the filter including an input coupled to the downconverter and an output coupled to the second input of the phase detection circuit.

14. The radio frequency transmitter of claim 13, wherein the LC tank circuit comprises an inductive element and a capacitive element; and wherein the inductive element of the LC tank circuit comprises the antenna.

15. The radio frequency transmitter of claim 13, wherein the muting circuit comprises a variable resistance coupled to the LC tank circuit, wherein the variable resistance is configured to be adjusted to control VCO power output.

16. The radio frequency transmitter of claim 13, wherein the drain-source resistance of the first transistor is controlled by controlling the voltage supplied to the gate of the first transistor.

17. The radio frequency transmitter of claim 13, wherein the drain-source resistance of the first transistor is controlled by controlling the current generated by the first and second current sources.

18. The radio frequency transmitter of claim 13, wherein the current supplied by the first and second current sources is adjusted to adjust the drain-source resistance of the first transistor to control VCO power output.

19. The radio frequency transmitter of claim 13, wherein the drain-source resistance of the first transistor is proportional to the ratio of currents generated by the first and second current sources such that $$r_{ds4} = \frac{I_1}{I_5},$$

where $r_{ds4}$ is the drain-source resistance of the first transistor, and Y are the currents generated by the first and second current sources.

20. The voltage-controlled oscillator of claim 13, wherein the muting circuit further comprises a resistor connected in series between the output of the second operational amplifier and the first current source, and wherein the drain-source resistance of the first transistor is proportional to the ratio of currents generated by the first and second current sources such that $$r_{ds4} = \frac{I_1}{I_5} \cdot R_1,$$

where $r_{ds4}$ is the drain-source resistance of the first transistor, $I_1$ and $I_5$ are the currents generated by the first and second current sources, and $R_1$ is the resistance of the resistor.

* * * * *